(12) United States Patent  (10) Patent No.: US 9,207,451 B2
Morikawa et al.  (45) Date of Patent: Dec. 8, 2015

(54) ACTUATOR, OPTICAL REFLECTING ELEMENT, AND IMAGE FORMING DEVICE USING OPTICAL REFLECTING ELEMENT

(71) Applicant: Panasonic Intellectual Property Management Co., Ltd., Osaka (JP)

(72) Inventors: Akihiro Morikawa, Osaka (JP); Soichiro Hiraoka, Hyogo (JP); Shinsuke Nakazono, Osaka (JP); Kazuki Komaki, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/389,988

(22) PCT Filed: May 30, 2013

(86) PCT No.: PCT/JP2013/003414
§ 371 (c)(1),
(2) Date: Oct. 1, 2014

(87) PCT Pub. No.: WO2013/187003
PCT Pub. Date: Dec. 19, 2013

(65) Prior Publication Data
US 2015/0049155 A1  Feb. 19, 2015

(30) Foreign Application Priority Data
Jun. 15, 2012  (JP) ................. 2012-135514

(51) Int. Cl.
G02B 26/08 (2006.01)
H01L 41/09 (2006.01)
H01L 41/04 (2006.01)
G02B 26/10 (2006.01)
(Continued)

(52) U.S. Cl.
CPC ........ *G02B 26/0858* (2013.01); *G02B 26/0841* (2013.01); *G02B 26/105* (2013.01); *G02B 27/0006* (2013.01); *H01L 41/042* (2013.01);
(Continued)

(58) Field of Classification Search
CPC ........... G02B 26/0841; G02B 26/0858; H01L 41/0933; H01L 41/042
See application file for complete search history.

(56) References Cited

U.S. PATENT DOCUMENTS

2005/0190426 A1  9/2005  Urakawa et al.
2011/0292479 A1  12/2011  Hiraoka et al.
2014/0375898 A1*  12/2014  Kurozuka et al. ............. 348/760

FOREIGN PATENT DOCUMENTS

JP  57-065699 A  4/1982
JP  2005-173435 A  6/2005
(Continued)

OTHER PUBLICATIONS

International Search Report issued in PCT/JP2013/003414, dated Aug. 13, 2013, with English translation.

*Primary Examiner* — Sarah Al Hashimi
(74) *Attorney, Agent, or Firm* — McDermott Will & Emery LLP

(57) ABSTRACT

An actuator includes a frame, a driver portion having one end connected to an inside of the frame, a movable portion connected to another end of the driver portion, and an electrode provided at the movable portion. The driver portion vibrates the movable portion by being driven by a driving signal. The electrode receives a high-frequency signal higher than that of the driving signal. This actuator is driven at a high speed by a large deflection angle, and can prevent dust from adhering to the movable portion.

15 Claims, 9 Drawing Sheets

(51) Int. Cl.
*G02B 27/00* (2006.01)
*G03G 15/04* (2006.01)

(52) U.S. Cl.
CPC ..... *H01L 41/0933* (2013.01); *G03G 15/04072* (2013.01)

(56) References Cited

FOREIGN PATENT DOCUMENTS

| | | | | |
|---|---|---|---|---|
| JP | 2005-249834 A | | | 9/2005 |
| JP | 2005249834 A | * | | 9/2005 |
| JP | 2007-093966 A | | | 4/2007 |
| JP | 2007-228246 A | | | 9/2007 |
| JP | 2010-097099 A | | | 4/2010 |
| JP | 2010097099 A | * | | 4/2010 |
| JP | 2010-102147 A | | | 5/2010 |
| JP | 2010-122480 A | | | 6/2010 |
| JP | 2011-004160 A | | | 1/2011 |
| JP | 2011-033754 A | | | 2/2011 |

* cited by examiner

ACTUATOR, OPTICAL REFLECTING ELEMENT, AND IMAGE FORMING DEVICE USING OPTICAL REFLECTING ELEMENT

RELATED APPLICATIONS

This application is the U.S. National Phase under 35 U.S.C. §371 of International Application No. PCT/JP2013/003414, filed on May 30, 2013, which in turn claims the benefit of Japanese Application No. 2012-135514, filed on Jun. 15, 2012, the disclosures of which Applications are incorporated by reference herein.

TECHNICAL FIELD

The present invention relates to an actuator, an optical reflecting element, and an image forming device including the optical reflecting element.

BACKGROUND ART

In recent years, actuators using Micro Electro Mechanical Systems (MEMS) have been studied. As the applications of the actuators, optical reflecting elements that scan laser light and project an image on, for example, a screen are being developed. In order to project an image, it is necessary to scan laser light using the optical reflecting element at a high speed by a large deflection angle.

When a movable portion including a reflecting portion of the optical reflecting element is driven at a high speed by a large deflection angle, dust in air may adhere to a portion surrounding the reflecting portion, and contaminates the reflecting portion. The contamination reduces an intensity of the reflected light due to decrease in the reflectance of the reflecting portion, and causes light scattering due to the laser light applied to the contaminated portion, accordingly reducing the brightness of the image and degrading the image.

In order to address these problems, PTL 1 discloses an optical reflecting element in which a reflecting portion is covered with an optical transparent component for preventing the contamination from adhering to the reflecting portion. PTL 2 discloses an optical reflecting element that prevents the contamination from adhering to the reflecting portion by providing a dust adherence portion around the reflecting portion. PTL 3 discloses an optical reflecting element that prevents the contamination from adhering to the reflecting portion by processing the lateral side of the reflecting portion to provide a dust adherence portion. PTL 4 discloses a method for preventing dust from adhering due to charging. This method uses a conductive material having a low resistivity as a transparent overcoat layer of the reflecting portion.

CITATION LIST

Patent Literature

PTL 1: Japanese Patent Laid-Open Publication No. 2005-173435
PTL 2: Japanese Patent Laid-Open Publication No. 2010-097099
PTL 3: Japanese Patent Laid-Open Publication No. 2010-102147
PTL 4: Japanese Patent Laid-Open Publication No. 2011-033754

SUMMARY

An actuator includes a frame, a driver portion having one end connected to an inside of the frame, a movable portion connected to another end of the driver portion, and an electrode provided at the movable portion. The driver portion is configured to cause the movable portion vibrate by being driven by a driving signal. The electrode is configured to receive a high-frequency signal higher than a frequency of the driving signal.

The actuator is driven at a high speed by a large deflection angle to prevent the movable portion from having dust adhering thereto.

DETAIL DESCRIPTION OF PREFERRED EMBODIMENTS

Exemplary Embodiment 1

Figure 1:
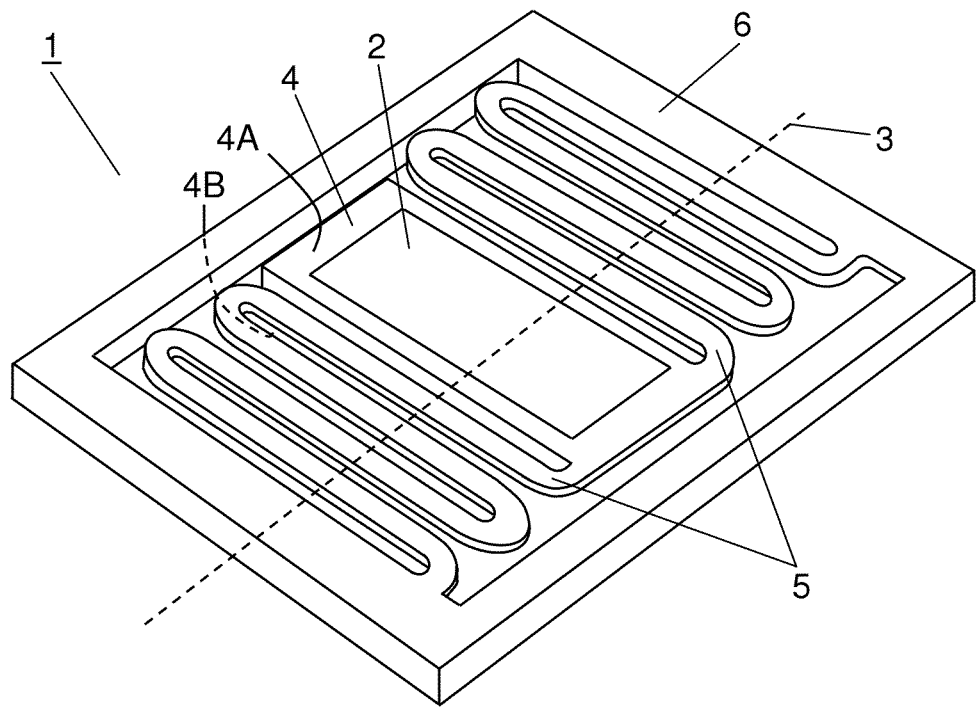
FIG. 1 is a perspective view of an optical reflecting element according to Exemplary Embodiment 1 of the present invention.

FIG. 1 is a perspective view of optical reflecting element 1 as an actuator according to Exemplary Embodiment 1 of the present invention. Optical reflecting element 1 includes movable portion 4 that rotates about rotation axis 3, driver portion 5 connected to movable portion 4, frame 6 connected to driver portion 5, and reflecting portion 2 provided at movable portion 4.

Figure 2:
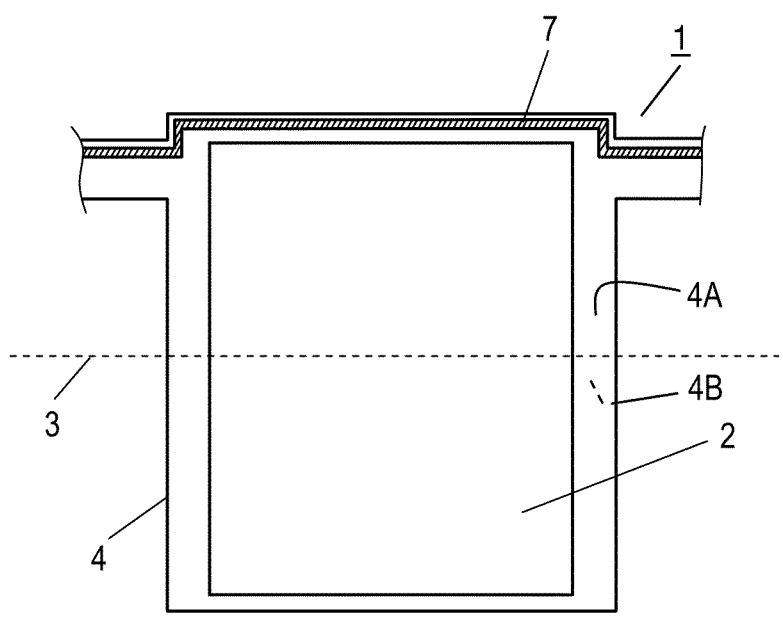
FIG. 2 is an enlarged view of the optical reflecting element according to Embodiment 1.

FIG. 2 is an enlarged view of optical reflecting element 1, and particularly, illustrates a periphery of movable portion 4. Movable portion 4 has surface 4A and back surface 4B opposite to surface 4A. Reflecting portion 2 is formed by a film made of a material, such as a metal (Ag-based material), that reflects light and provided on surface 4A of movable portion 4, and reflects a light beam emitted to movable portion 4. Electrode 7 is provided at a periphery of surface 4A of movable portion 4, and receives a driving signal for driving driver portion 5, with connection to driver portion 5.

Driver portion 5 includes a substrate made of silicon, a lower electrode formed on the substrate, a piezoelectric layer made of a piezoelectric material, such as lead zirconate titanate (PZT) and formed on the lower electrode, and an upper electrode formed on the piezoelectric layer.

Movable portion 4, driver portion 5, and frame 6 are formed by patterning the lower electrode, the piezoelectric layer, and the upper electrode by dry etching or wet etching, and processing the substrate by inductively coupled plasma (ICP) dry etching to have a predetermined shape.

Upon having an electric field applied between the lower electrode and the upper electrode, the piezoelectric layer expands and contracts in a planar direction by an inverse piezoelectric effect. Here, a force generated in the piezoelectric layer produces a moment in a thickness direction of driver portion 5 to bend driver portion 5. The bending of portion 5 changes a slope of movable portion 4 connected to driver portion 5, and causes movable portion 4 to rotate about rotation axis 3.

Figure 3:
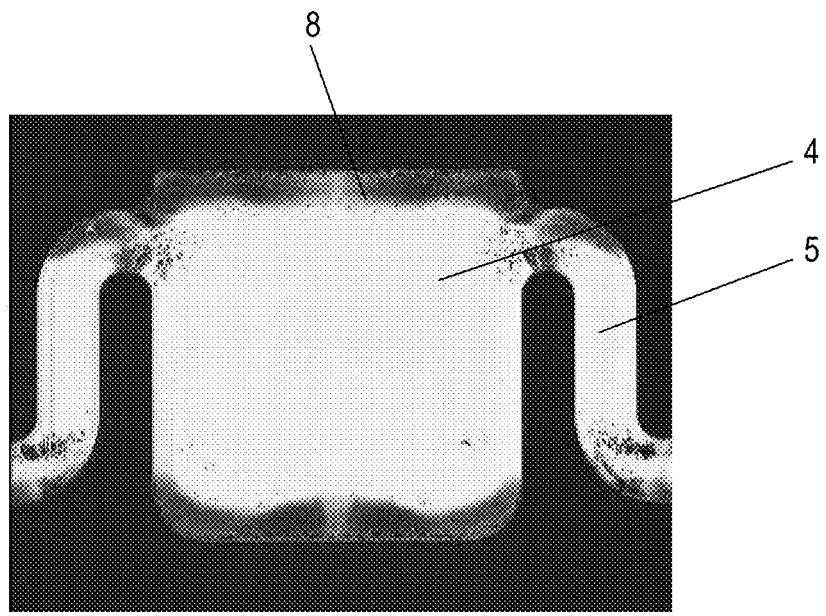
FIG. 3 is an enlarged view of a comparative example of an optical reflecting element.

FIG. 3 is an enlarged view of a comparative example of an optical reflecting element having the same structure as optical reflecting element 1 except for not including electrode 7, and is a microscope photograph of movable portion 4 when the optical reflecting element is driven for a long time more than 300 hours at a driving frequency of 30 kHz in the air by a deflection angle of ±8 degrees. The black portion is foreign substance 8 adhering to the optical reflecting element. As illustrated in FIG. 3, when movable portion 4 is driven at a high speed by a large deflection angle, foreign substance 8 adheres around movable portion 4 and driver portion 5, and discolors the portion having the substance adhering. When the comparative example of the optical reflecting element is put into a package of hermetic sealing filled with nitrogen gas and others on the same condition is driven, foreign substance 8 does not adhere to movable portion 4. Thus, it is confirmed that foreign substance 8 adhering to movable portion 4 can be dust in the air. The dust adhering to movable portion 4 reduces the reflectance of movable portion 4 to reflecting portion 2, and the resonance frequency of the comparative example of the optical reflecting element.

As shown in FIG. 3, the dust is particularly tends to adhere to a portion close to the periphery of movable portion 4 displaced largely. The displacement of movable portion 4 causes airflow around movable portion 4, and the static electricity generated by collision and friction between the air and the dust significantly affects the adherence of the dust to movable portion 4. Thus, preventing the static electricity from being generated in movable portion 4 is effective to prevent the dust from adhering.

Optical reflecting element 1 according to Embodiment 1 suppresses the adherence of dust by preventing static electricity from being generated. A method for preventing static electricity from being generated in optical reflecting element 1 will be described below.

Figure 4:
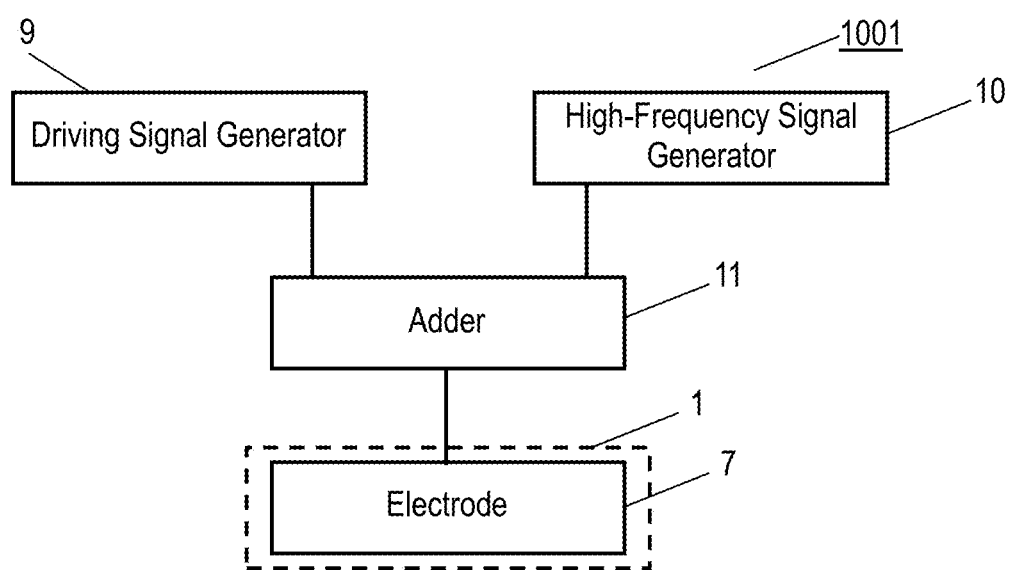
FIG. 4 is a block diagram of a driver circuit connected to the optical reflecting element according to Embodiment 1.

FIG. 4 is a block diagram of driver circuit 1001 that generates a signal to be input to optical reflecting element 1. Driver circuit 1001 includes driving signal generator 9, high-frequency signal generator 10, and adder 11. Driving signal generator 9 generates a driving signal that rotates movable portion 4 about rotation axis 3 at a predetermined frequency by driving driver portion 5. The driving signal has a sinewave voltage having a driving frequency of 30 kHz according to Embodiment 1. High-frequency signal generator 10 generates a high-frequency signal having a frequency higher than the driving frequency of the driving signal. Adder 11 adds the high-frequency signal to the driving signal to generate a combined driving signal, and inputs the combined driving signal to electrode 7. In other words, driving signal generator 9 inputs the driving signal to electrode 7 through adder 11, and high-frequency signal generator 10 inputs the high-frequency signal to electrode 7 through adder 11. According to Embodiment 1, the frequency of the high-frequency signal ranges from 0.5 MHz to 2 MHz. The voltage of the high-frequency signal is adjusted such that movable portion 4 rotates and vibrates at a predetermined frequency (30 kHz according to Embodiment 1) by a predetermined deflection angle (±8 degrees according to Embodiment 1), even when the high-frequency signal is added to the driving signal. The high-frequency signal input to electrode 7 generates an electric charge having a high frequency at the outer periphery of driver portion 5 and movable portion 4. This charge compensates the static electricity generated in movable portion 4 to suppress the charging around movable portion 4, thus preventing the dust from adhering to movable portion 4 and driver portion 5.

Figure 5:
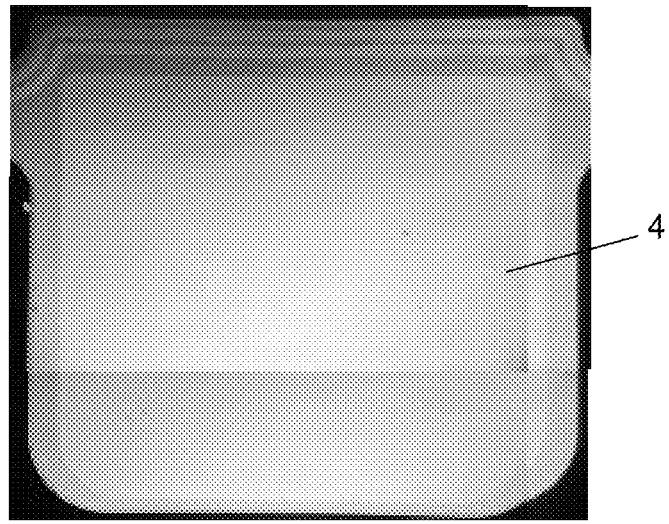
FIG. 5 is an enlarged view of the optical reflecting element according to Embodiment 1.

FIG. 5 is an enlarged view of optical reflecting element 1, and is a microscope photograph of movable portion 4 when the optical reflecting element is driven for a long time more than 300 hours at a driving frequency of 30 kHz by a deflection angle of ±8 degrees similarly to the comparative example of the optical reflecting element shown in FIG. 3. Dust observed on the comparative example of the optical reflecting element shown in FIG. 3 is not observed on optical reflecting element 1 shown in FIG. 5. Optical reflecting element 1 provides an advantage of preventing dust from adhering to optical reflecting element 1 by adding the high-frequency signal to the driving signal and inputting the resultant signal to electrode 7.

Figure 6:
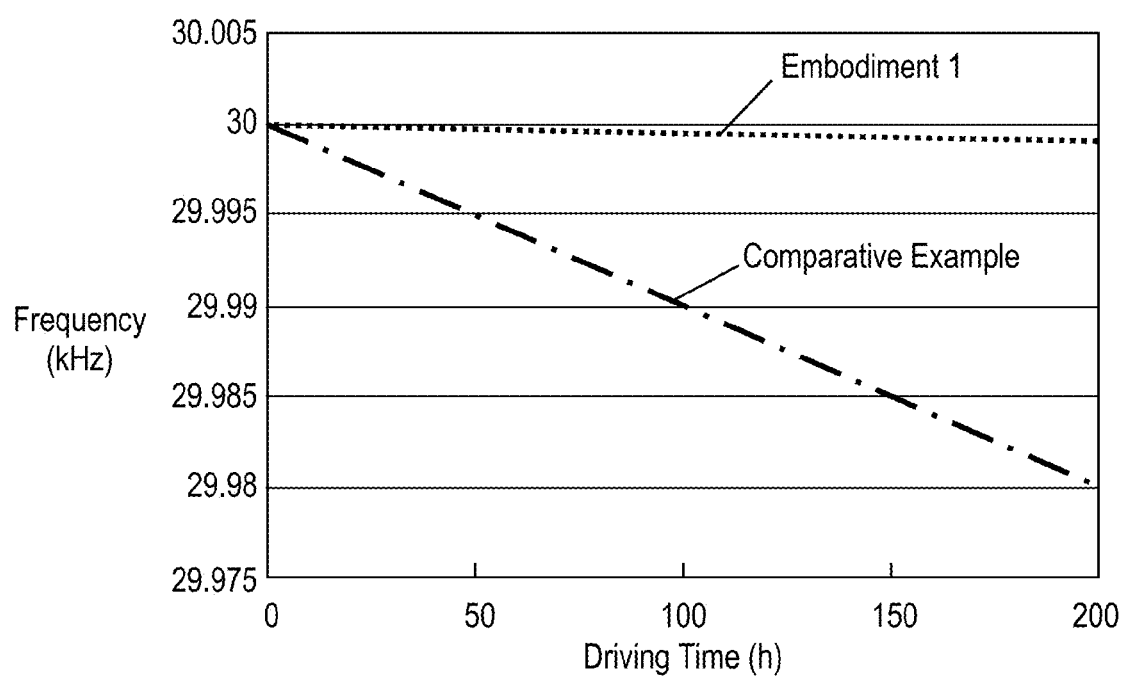
FIG. 6 indicates a relationship between a driving time and a resonance frequency of the optical reflecting element according to Embodiment 1.

FIG. 6 indicates a relationship between a driving time and a mechanical natural resonance frequency of movable portion 4 of optical reflecting element 1, together with that of the comparative example of the optical reflecting element. In FIG. 6, the horizontal axis represents a driving time, and the vertical axis represents a resonance frequency. As indicated in FIG. 6, in the comparative example of the optical reflecting element, movable portion 4 becomes heavier due to the adherence of dust according to the lapse of the driving time, and the resonance frequency decreases. In contrast, even when optical reflecting element 1 according to Embodiment 1 is driven for a long time, the resonance frequency does not decrease so much, thus providing an advantage of preventing dust from adhering to optical reflecting element 1.

When the voltage of the high-frequency signal added to the driving signal is excessively high, the high-frequency vibration mode of optical reflecting element 1 increases and the deflection angle decreases. When the voltage of the high-frequency signal is excessively low, a charge having the high frequency generated due to the high-frequency signal is reduced, and the advantage of preventing dust cannot be sufficiently produced. In optical reflecting element 1 according to Embodiment 1, the high-frequency signal having 5% to 10% of the driving voltage is added to the driving voltage. Within the range of the voltage, the deflection angle of optical reflecting element 1 does not decrease, and the advantage of preventing dust can be sufficiently produced. However, depending on the structure and the usage environment of optical reflecting element 1, a voltage out of the range from 5% to 10% of the driving voltage of the driving signal can produce the same advantage.

Although the frequency of the high-frequency signal of optical reflecting element 1 according to Embodiment 1 ranges from 0.5 MHz to 2 MHz, the frequency may be swept from 0.5 MHz to 2 MHz. Since charges having different frequency components are generated during the sweeping, the advantage of preventing adherence of dust can be more produced than the optical reflecting element to which a high-frequency signal having a predetermined frequency is input without the sweeping of the frequency. The same advantages can be produced by sweeping the frequency of the high-frequency signal from 0.5 MHz to 2 MHz and from 2 MHz to 0.5 MHz.

Optical reflecting element 1 according to Embodiment 1 provides the advantage of preventing adherence of dust by adding the high-frequency signal having a frequency ranging from 0.5 MHz to 2 MHz to the rotation driving signal at the driving frequency of 30 kHz. Since a frequency at which the advantage of preventing adherence of dust is maximized may change according to the frequency of the driving signal to be input to electrode 7, the frequency of the high-frequency signal is not limited to the range from 0.5 MHz to 2 MHz. As optical reflecting element 1 according to Embodiment 1 provides the advantage of preventing adherence of dust, by adding the high-frequency signal from 0.5 MHz to 2 MHz to the rotation driving signal at the driving frequency of 30 kHz, when the frequency of the high-frequency signal is higher than that of the driving signal, the advantage can be obtained.

In optical reflecting element 1 according to Embodiment 1, a pair of driver portions 5 rotates and vibrates movable portion 4 while supporting movable portion 4 connected to opposite side of movable portion 4. The same advantage can be obtained from not limited to such a structure but from a structure in which driver portion 5 rotates and vibrates movable portion 4 while supporting movable portion 4 connected to only one side of movable portion 4.

Figure 7:
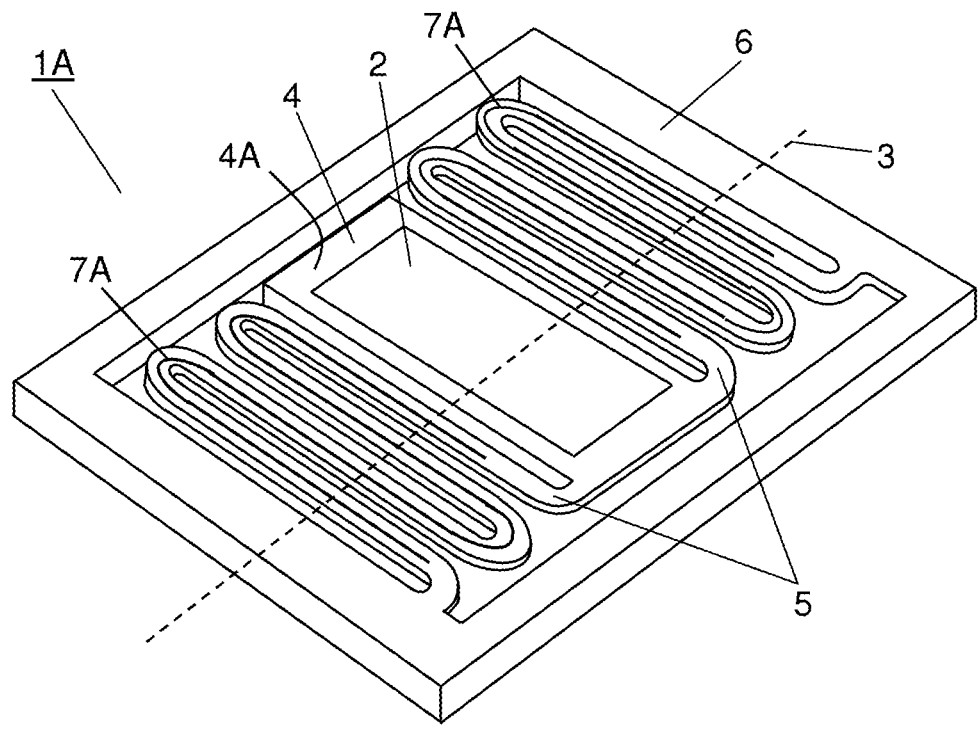
FIG. 7 is a perspective view of another optical reflecting element according to Embodiment 1.

Optical reflecting element 1 according to Embodiment 1 utilizes electrode 7 commonly as an electrode that receives the driving signal for driving driver portion 5 and an electrode that receives the high-frequency signal, and provides the advantage of preventing adherence of dust by adding the high-frequency signal to the driving signal. FIG. 7 is a perspective view of another optical reflecting element 1A according to Embodiment 1. In FIG. 7, components identical to those of optical reflecting element 1 shown in FIG. 1 are denoted by the same reference numerals. Optical reflecting element 1A further includes electrode 7A that receives a driving signal. Electrode 7A of optical reflecting element 1A receives a driving signal having a high-frequency signal not added thereto, and electrode 7 receives not the driving signal but the high-frequency signal. Optical reflecting element 1A can produce the advantage of preventing adherence of dust similarly to optical reflecting element 1.

Although driver portion 5 of optical reflecting elements 1 and 1A is driven by inverse piezoelectric effect according to Embodiment 1, but may be driven electrostatically or electromagnetically, thus providing the advantage of preventing adherence of dust by static electricity around movable portion 4.

The conventional optical reflecting element disclosed in PTL 1 needs an optical transmission component and antireflection coating, and increases the cost. Furthermore, the light that is reflected from the optical transmission component without passing through the optical transmission component may become stray light and degrade the image. Each of the conventional optical reflecting elements disclosed in PTL 2 and PTL 3 includes a dust adherence portion, which increases a size of the movable portion, and stymies miniaturization of the element. Furthermore, an additional process for processing the adherence portion increases the process time, or complicates the fabrication process. In the conventional method disclosed in PTL 4, it is necessary to newly develop a transparent protection film having conductivity with consideration given to the reflectance.

Optical reflecting elements 1 and 1A according to Embodiment 1 that do not use the optical transmission component may have a small size and small cost.

Optical reflecting elements 1 and 1A according to Embodiment 1 that do not need to include the dust adherence portion in movable portion 4 can have a small size, eliminate the need for processing the dust adherence portion, and reduce the tact time.

Optical reflecting elements 1 and 1A according to Embodiment 1 that do not use the transparent protection film having conductivity eliminate the need for designing and developing the transparent protection film.

Exemplary Embodiment 2

Figure 8:
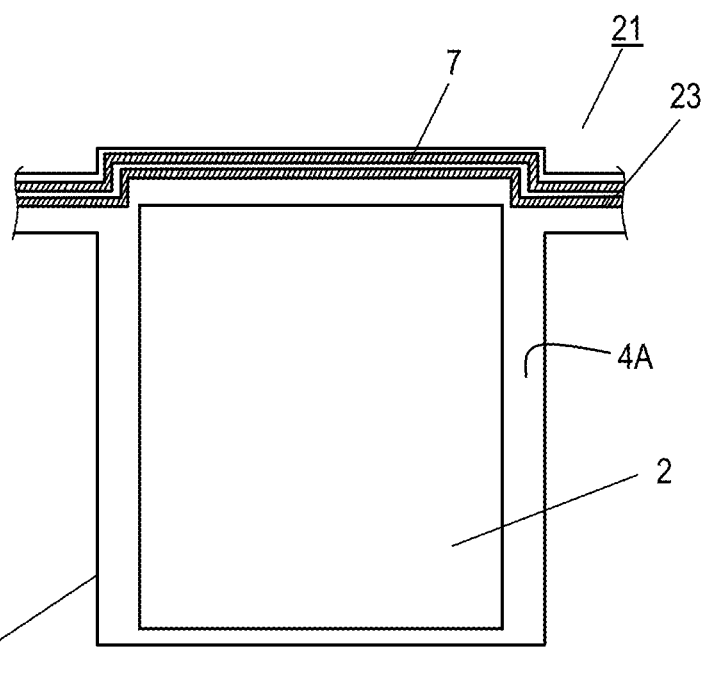
FIG. 8 is an enlarged view of an optical reflecting element according to Exemplary Embodiment 2 of the present invention.

FIG. 8 is an enlarged view of optical reflecting element 21 according to Exemplary Embodiment 2. In FIG. 8, components identical to those of optical reflecting element 1 according to Embodiment 1 shown in FIG. 2 are denoted by the same reference numerals. FIG. 8 illustrates movable portion 4. As illustrated in FIG. 8, optical reflecting element 21 according to Embodiment 2 further includes grounding electrode 23 provided on an outer periphery of surface 4A of movable portion 4 of optical reflecting element 1 shown in FIG. 2. Movable portion 4 is grounded via grounding electrode 23. Grounding electrode 23 provided on the outer periphery of movable portion 4 can eliminate the surface charge remaining on movable portion 4. This configuration completely removes the static electricity generated by friction with air at the outer periphery of movable portion 4, thus further enhancing the advantage of preventing dust from adhering to movable portion 4.

Figure 9:
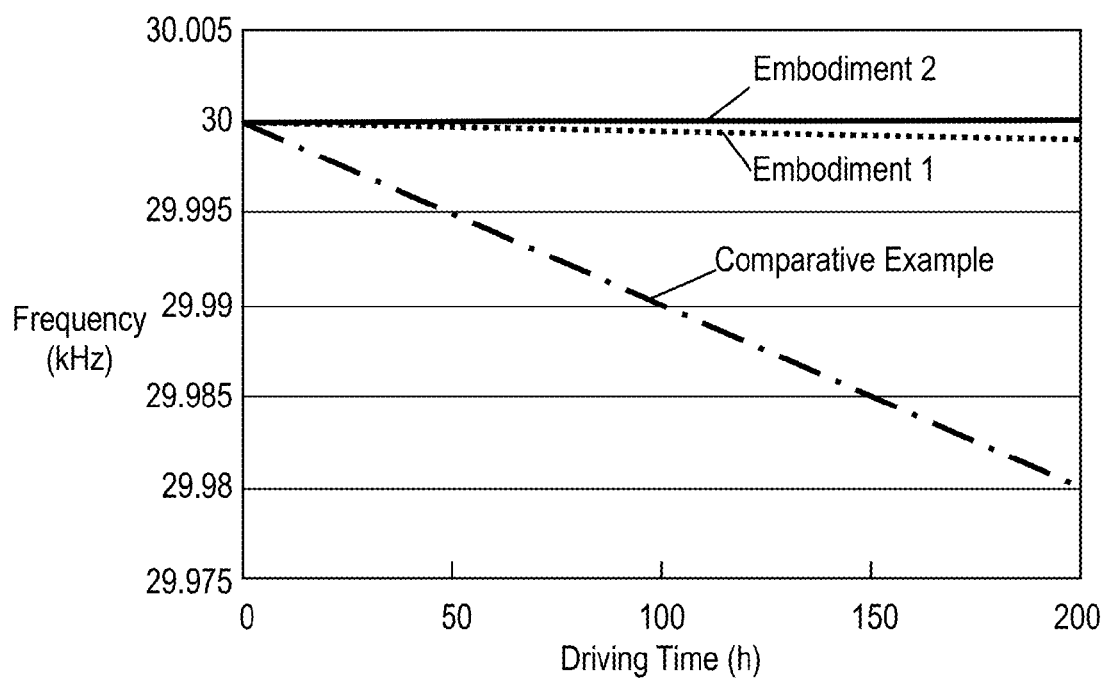
FIG. 9 shows a relationship between a driving time and a resonance frequency of the optical reflecting element according to Embodiment 2.

FIG. 9 indicates a relationship between a driving times and a mechanical natural resonance frequency of movable portion 4 of optical reflecting element 21 according to Embodiment 2 together with that of optical reflecting element 1 according to Embodiment 1 and that of the comparative example of the optical reflecting element. In FIG. 9, the horizontal axis represents the driving time, and the vertical axis represents the resonance frequency. In the comparative example of the optical reflecting element, movable portion 4 becomes heavier due to the adherence of dust with the lapse the driving time, and the resonance frequency decreases. Although optical reflecting element 1 according to Embodiment 1 has a rate less than that of the comparative example of the optical reflecting element, the resonance frequency decreases with the lapse of the driving time. In contrast, even after optical reflecting element 21 according to Embodiment 2 is driven for a long time more than 200 hours, the resonance frequency does not change, thus having the resonance frequency constant. In optical reflecting element 21 according to Embodiment 2, the charge generated on the surface of movable portion 4 can be suppressed by inputting a high-frequency signal to electrode 7, and the remaining surface charge can be eliminated from the periphery of movable portion 4 by grounding of grounding electrode 23 on the outer periphery of movable portion 4. Thus, the advantage of preventing adherence of dust in the air can be more improved than optical reflecting element 1 according to Embodiment 1.

Figure 10A:
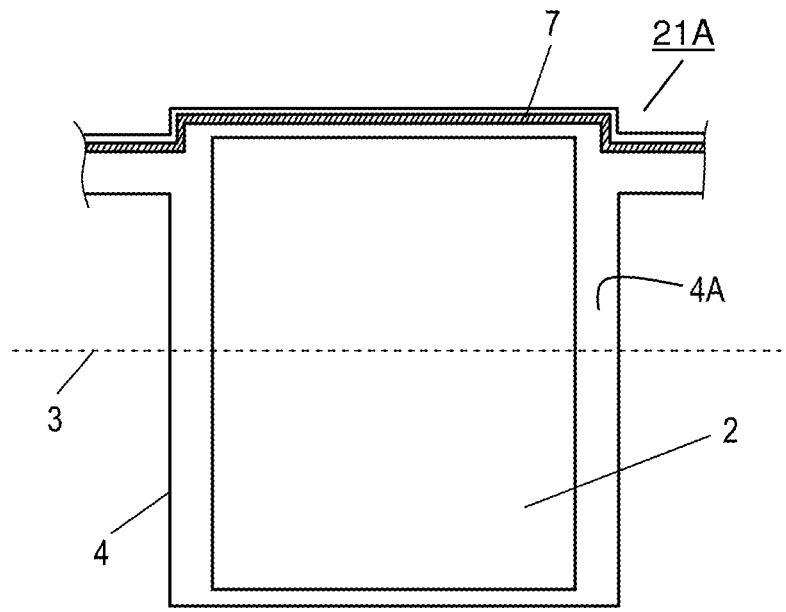
FIG. 10A is an enlarged view of another optical reflecting element according to Embodiment 2.
Figure 10B:
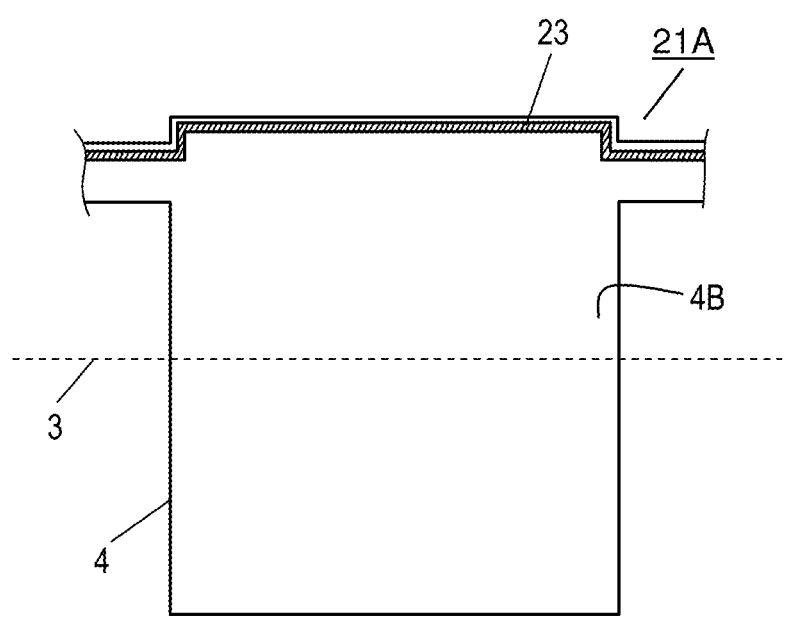
FIG. 10B is an enlarged view of the optical reflecting element shown in FIG. 10A.

FIGS. 10A and 10B are enlarged views of another optical reflecting element 21A according to Embodiment 2. In FIGS. 10A and 10B, components identical to those of optical reflecting element 21 shown in FIG. 8 are denoted by the same reference numerals. In optical reflecting element 21 shown in FIG. 8, grounding electrode 23 is grounded only at the outer periphery of surface 4A constituting reflecting portion 2 of movable portion 4. In optical reflecting element 21A shown in FIGS. 10A and 10B, grounding electrode 23 is provided on the outer periphery of a back surface 4B of movable portion 4, and back surface 4B is grounded. This structure can prevent dust from adhering to back surface 4B, which further enhances the prevention of dust from adhering to movable portion 4. Furthermore, since back surface 4B of movable portion 4 does not have reflecting portion 2 thereon, the adherence of dust does not cause any problem in decrease in the reflectance of light and the light scattering. However, increase in the weight of movable portion 4 with the dust changes the resonance frequency. The change in the resonance frequency may degrade the images when optical reflecting element 21 is applied to an image forming device. The resonance frequency is preferably constant, and grounding of back surface 4B of movable portion 4 is effective in maintaining the constant resonance frequency.

Figure 11:
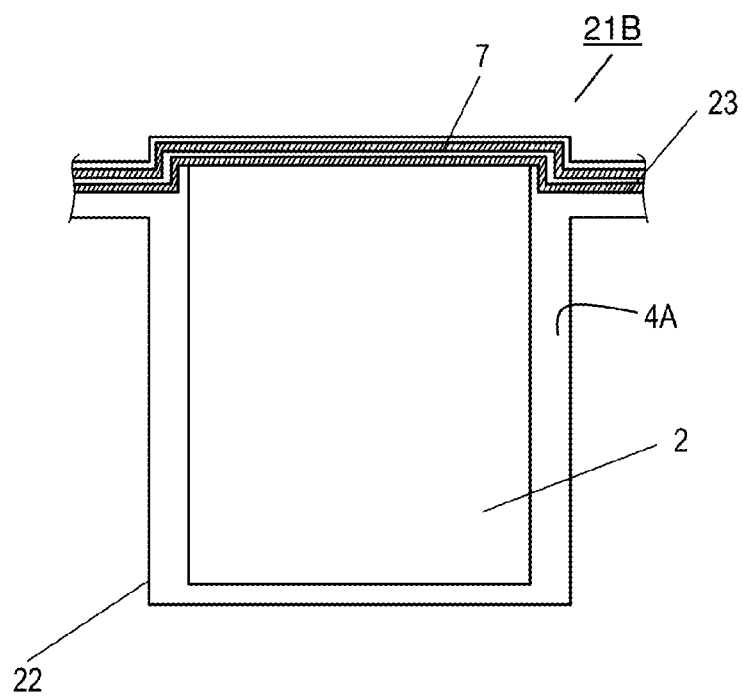
FIG. 11 is an enlarged view of another optical reflecting element according to Embodiment 2.

FIG. 11 is an enlarged view of still another optical reflecting element 21B according to Embodiment 2. In FIG. 11, components identical to those of optical reflecting element 21 shown in FIG. 8 are denoted by the same reference numerals. In optical reflecting element 21B shown in FIG. 11, reflecting portion 2 is also grounded by connecting grounding electrode 23 to reflecting portion 2. Particularly, when reflecting portion 2 is made of a conductive material, such as metal, the grounding area of movable portion 4 becomes wider. Thus, the efficiency of dissipating the surface charge outside of movable portion 4 can be improved, which further enhances the prevention of dust from adhering to movable portion 4.

Although driver portion 5 of optical reflecting elements 21, 21A, and 21B according to Embodiment 2 is driven by inverse piezoelectric effect, the driver portion may be driven electrostatically or electromagnetically, thus providing the advantage of preventing adherence of dust by static electricity around movable portion 4.

Exemplary Embodiment 3

Figure 12:
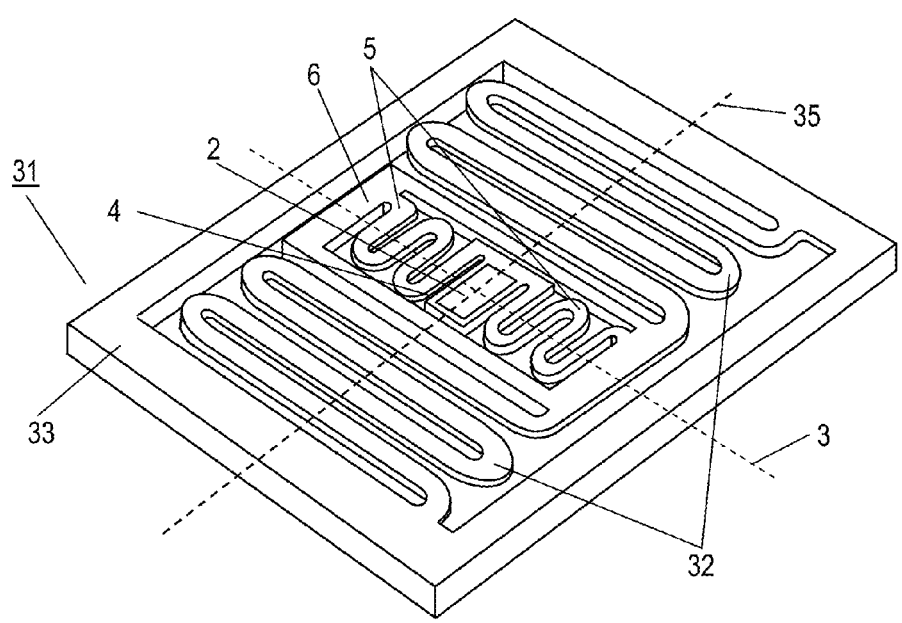
FIG. 12 is a perspective view of an optical reflecting element according to Exemplary Embodiment 3 of the present invention.

FIG. 12 is a perspective view of optical reflecting element 31 according to Exemplary Embodiment 3. In FIG. 12, components identical to those of the optical reflecting elements shown in FIGS. 1 to 10B according to Embodiments 1 and 2 are denoted by the same reference numerals. Optical reflecting element 31 according to Embodiment 3 further includes driver portion 32 having an end connected to an outside of frame 6 of the optical reflecting elements according to Embodiments 1 and 2 and frame 33 connected to the other end of driver portion 32. The other end of driver portion 32 is connected to an inside of frame 33. Driver portion 32 is connected to frame 6 in a direction substantially perpendicular to driver portion 5. Similarly to driver portion 5, driver portion 32 includes a substrate made of silicon, a lower electrode formed on the substrate, a piezoelectric layer made of a piezoelectric material, such as lead zirconate titanate (PZT) formed on the lower electrode, and an upper electrode formed on the piezoelectric layer. Upon having an electric field applied between the lower electrode and the upper electrode of driver portion 32, the piezoelectric layer expands and contracts by inverse piezoelectric effect in a direction perpendicular to a thickness direction in which the lower electrode, the piezoelectric layer, and the upper electrode are stacked. Here, a force generated in the piezoelectric layer produces a moment in the thickness direction of driver portion 32 to bend driver portion 32. This moment changes a slope of movable portion 4 connected to driver portion 32, and causes movable portion 4 to rotate about rotation axis 35.

Movable portion 4 rotates and vibrates in directions in which driver portion 5 is substantially perpendicular to driver portion 32. Thus, the light reflected from reflecting portion 2 of movable portion 4 can be scanned in two-dimensional directions.

Figure 13:
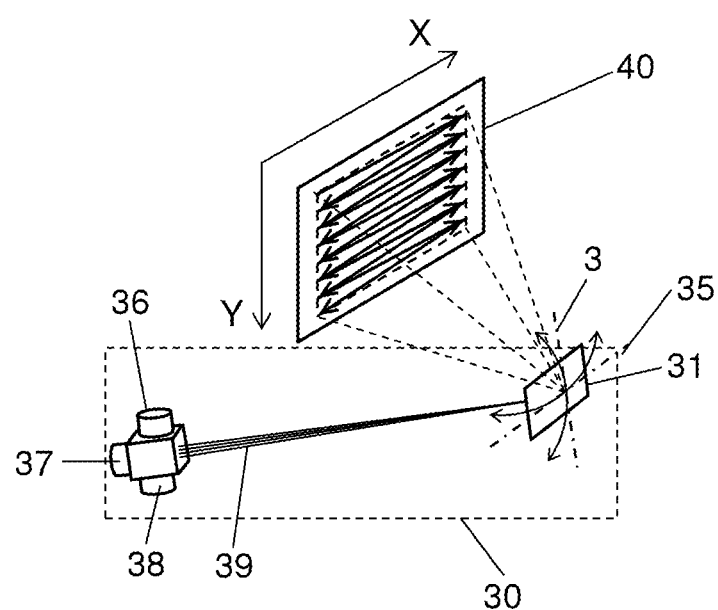
FIG. 13 is a schematic view of an image forming device including the optical reflecting element according to Embodiment 3.

FIG. 13 is a schematic view of image forming device 30 according to Embodiment 3. Image forming device 30 includes optical reflecting element 31 and laser light sources 36 to 38.

Laser light source 36 emits red laser light. Laser light source 37 emits green laser light. Laser light source 38 emits blue laser light. Laser light 39 emitted from laser light sources 36 to 38 enters to optical reflecting element 31. Laser light 39 is reflected from reflecting portion 2. According to Embodiment 3, reflecting portion 2 of movable portion 4 of optical reflecting element 31 vibrates and rotates about rotation axis 3 at a frequency of 30 kHz in an X-axis direction, and about rotation axis 35 at a frequency of 60 kHz in a Y-axis direction, thus scanning laser light 39 at these frequencies. Laser light 39 and optical reflecting element 31 are synchronized with an input image signal that modulates laser light 39, thus projecting a two-dimensional full-color image onto screen 40 at low power consumption, in high definition, and with high color reproducibility.

Image forming device 30 includes optical reflecting element 31 with two-axis driving including the optical reflecting element according to Embodiments 1 and 2. Even when image forming device 30 is rotationally driven about rotation axis 3 horizontally at a high speed by a large deflection angle, contamination due to adherence of dust in the air can be suppressed in the outer periphery of movable portion 4, and an image of high brightness and high definition can be maintained for a long time.

Image forming device 30 according to Embodiment 3 includes three colors of laser light sources 36 to 38, but may include monochrome, two-color, and more than three colors of laser light sources, which can produce the same advantage. Furthermore, image forming device 30 according to Embodiment 3 includes optical reflecting element 31 that is driven along two axes, but may include an optical reflecting element that is driven along a single axis, which can produce the same advantage.

In image forming device 30 according to Embodiment 3, optical reflecting element 31 scans laser light 39 at the frequency of 30 kHz in the X-axis direction, and at the frequency of 60 kHz in the Y-axis direction. The advantage of preventing dust from adhering to movable portion 4 can be provided even when optical reflecting element 31 scans laser light 39 at a frequency different from these frequencies.

The optical reflecting elements are described as an actuator according to Embodiments 1 to 3. An actuator including movable portion 4 that rotates at a high speed may have the same advantage.

INDUSTRIAL APPLICABILITY

The actuator according to the present invention can prevent dust from adhering even it is driven at a high speed by a large deflection angle. Thus, the actuator is applicable to small image projectors, such as mobile projectors and head-mounted displays, that can stably project images of high brightness and high definition.

REFERENCE MARKS IN DRAWINGS 2 reflecting portion
4 movable portion 5 driver portion (first driver portion)
6 frame (first frame)
7 electrode (first electrode)
7A electrode (second electrode)
23 grounding electrode
30 image forming device
32 driver portion (second driver portion)
33 frame (second frame)
36 laser light source
37 laser light source
38 laser light source
39 laser light

The invention claimed is:

1. An actuator comprising:
a first frame;
a first driver portion having one end connected to an inside of the first frame;
a movable portion connected to another end of the first driver portion; and
a first electrode provided at the movable portion,
wherein the first driver portion is configured to cause the movable portion vibrate by being driven by a driving signal, and
wherein the first electrode is configured to receive a high-frequency signal higher than a frequency of the driving signal.

2. The actuator according to claim 1, wherein the driving signal is configured to have the high-frequency signal added thereto, and the driving signal with the high-frequency signal added thereto is input to the first electrode.

3. The actuator according to claim 1, further comprising a second electrode that receives the driving signal.

4. The actuator according to claim 1, wherein the first electrode is provided at an outer periphery of the movable portion.

5. The actuator according to claim 1, wherein the frequency of the high-frequency signal ranges from 0.5 MHz to 2 MHz.

6. The actuator according to claim 1, wherein the frequency of the high-frequency signal is swept.

7. The actuator according to claim 1, wherein the high-frequency signal has a voltage not higher than 10% of a voltage of the driving signal.

8. The actuator according to claim 1, further comprising a grounding electrode provided at the movable portion as to ground the movable portion.

9. The actuator according to claim 8, wherein the grounding electrode is provided at an outer periphery of the movable portion.

10. The actuator according to claim 8,
wherein the first electrode is provided on a surface of the movable portion, and
wherein the grounding electrode is provided on a back surface of the movable portion opposite to the surface of the movable portion.

11. The actuator according to claim 1, further comprising:
a second driver portion having one end connected to an outside of the first frame; and
a second frame connected to another end of the second driver portion,
wherein the first driver portion and the second driver portion extend in directions substantially perpendicular to each other.

12. An optical reflecting element comprising:
the actuator according to claim 1; and
a reflecting portion provided on a surface of the movable portion of the actuator.

13. The optical reflecting element according to claim 12, further comprising a grounding electrode provided at the movable portion as to ground the reflecting portion.

14. The optical reflecting element according to claim 13, wherein the grounding electrode is connected to the reflecting portion.

15. An image forming device comprising:
the optical reflecting element according to claim 12; and
a laser light source that emits laser light that is reflected from the reflecting portion of the optical reflecting element and scanned.

* * * * *